(12) United States Patent
Evans et al.

(10) Patent No.: US 6,442,054 B1
(45) Date of Patent: Aug. 27, 2002

(54) SENSE AMPLIFIER FOR CONTENT ADDRESSABLE MEMORY

(75) Inventors: Allen L. Evans, Roseville; Wen-Kuan Fang, San Jose, both of CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 09/866,056

(22) Filed: May 24, 2001

(51) Int. Cl.[7] ............................................. G11C 15/00
(52) U.S. Cl. ........................ 365/49; 365/207; 365/210
(58) Field of Search ...................... 365/49, 207, 203, 365/210

(56) References Cited

U.S. PATENT DOCUMENTS 6,307,797 B1 * 10/2001 Fournez et al. ............. 365/203
6,307,798 B1 * 10/2001 Ahmed et al. ............... 365/207

* cited by examiner

Primary Examiner—Tan T. Nguyen
(74) Attorney, Agent, or Firm—Bever, Hoffman & Harms LLP

(57) ABSTRACT

A sense amplifier includes a first transistor coupled between a match line of a CAM array and a $V_{DD}$ supply terminal. The match line is pre-charged through the first transistor to a voltage equal to a reference voltage minus the first transistor threshold voltage, $V_{T1}$. The match line is coupled to the source of a second transistor, which has a threshold voltage $V_{T2}$, wherein $V_{T2} > V_{T1}$. A dummy line of the CAM array, which is coupled to the gate of the second transistor, is pre-charged to the reference voltage. A storage node, which is coupled to the drain of the second transistor, is pre-charged to the $V_{DD}$ supply voltage. A non-match condition causes the voltage on the match line to be pulled down. When the voltage on the dummy line exceeds the voltage on the match line by $V_{T2}$, the second transistor turns on, thereby pulling down the storage node.

10 Claims, 3 Drawing Sheets

SENSE AMPLIFIER FOR CONTENT ADDRESSABLE MEMORY

FIELD OF THE INVENTION

The present invention relates to a sense amplifier for use in a content addressable memory (CAM) array.

RELATED ART

A compare operation within a CAM array is typically performed by charging a large number of match lines to a $V_{DD}$ supply voltage. If a match condition exists on a particular match line, the match line will remain charged at the $V_{DD}$ supply voltage. If no match condition exists on a particular match line, then this match line is pulled down to the $V_{SS}$ supply voltage (i.e., ground). Typically, many non-match conditions will exist for each compare operation. Thus, each compare operation consists of charging and discharging many match lines across the full $V_{DD}$ supply voltage. As a result, a conventional CAM array consumes a large amount of power. In general, the match lines are subjected to a relatively large signal swing in order to allow the state of the match signal to be accurately sensed.

It would therefore be desirable to have an improved sense amplifier that is able to sense smaller match line signal swings.

SUMMARY

Accordingly, the present invention provides a sense amplifier that operates in response to a voltage swing as small as the difference between two transistor threshold voltages.

In accordance with one embodiment, a sense amplifier includes a first transistor that is used to pre-charge a match line of a CAM array. The first transistor is coupled between the $V_{DD}$ supply terminal and the match line. During the pre-charge operation, the gate of the first transistor is coupled to receive a reference voltage $V_{REF}$. As a result, the match line is pre-charged to a voltage equal to $V_{REF}$ minus $V_{T1}$, where $V_{T1}$ is the threshold voltage of the first transistor. The reference voltage $V_{REF}$ is selected to be less than the $V_{DD}$ supply voltage in order to achieve power savings.

The sense amplifier also includes a storage node that is pre-charged to the $V_{DD}$ supply voltage. The state of the storage node is used to determine whether a match or non-match condition exists on the match line during a compare operation.

A second transistor is coupled between the match line and the storage node of the sense amplifier. The gate of the second transistor is coupled to a dummy line of the CAM array. The dummy line is pre-charged to a voltage equal to the reference voltage $V_{REF}$. As a result, the gate-to-source voltage $V_{GS}$ of the second transistor is equal to $V_{T1}$ (i.e., or the difference between the gate voltage ($V_{REF}$) and the match line voltage ($V_{REF}-V_{T1}$)). The second transistor is designed to have a second threshold voltage $V_{T2}$, which is greater than the threshold voltage of the first transistor, $V_{T1}$. As a result, the second transistor is initially turned off.

During a compare operation, a row of CAM cells coupled to the match line will exhibit a match condition or a non-match condition. If a match condition exists, the match line remains at a voltage of $V_{REF}-V_{T1}$. The second transistor remains off under these conditions, thereby allowing the storage node to remain at a logic high state.

If a non-match condition exists, the match line is pulled down toward ground. As soon as the match line is pulled down to a voltage equal to $V_{REF}$ minus $V_{T2}$, the second transistor is turned on, thereby pulling down the storage node to a logic low state. Note that the voltage swing required by the sense amplifier is equal to the difference between the first and second threshold voltages (i.e., $V_{T2}-V_{T1}$).

In one variation, the sense amplifier is expanded such that a second match line is coupled to the storage node in the same manner as the first match line. In this case, the two match lines correspond with a single row of the CAM array.

In accordance with another aspect of the present invention, a current mirror circuit is coupled to the storage node, thereby supplying a small constant current to the storage node. This constant current helps to maintain the logic high state of the storage node during non-match conditions.

The present invention will be more fully understood in view of the following description and drawings.

DETAILED DESCRIPTION

Figure 1:
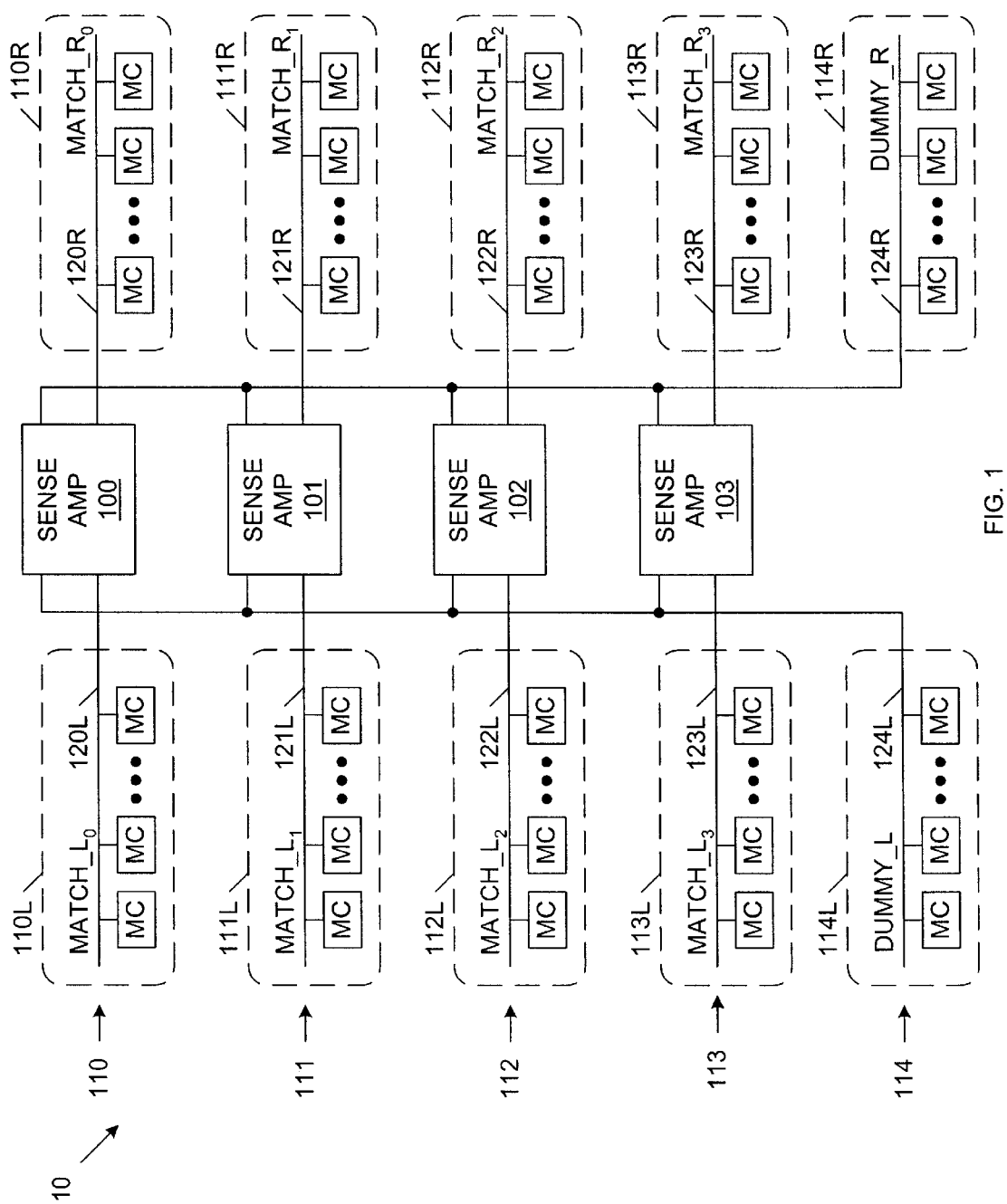
FIG. 1 is a block diagram of a CAM block in accordance with one embodiment of the present invention.

FIG. 1 is a block diagram of a CAM block 10 in accordance with one embodiment of the present invention. CAM block 10 includes four rows of CAM cells 110–113, one row of dummy cells 114 and four sense amplifiers 100–103. The row of dummy cells 114 is designed to have the same electrical characteristics (e.g., capacitance) and be located in the same environment as each of the rows of CAM cells 110–113. As will become apparent in view of the disclosure below, rows 110–114 form common mode circuits. Within CAM block 10, the CAM cells are labeled "MC" and the dummy cells are labeled "DC". Each row of CAM cells 110–113 is divided into left half-rows 110L–113L and right half-rows 110R–113R, respectively. Similarly, the row of dummy cells 114 is divided into left half-row 114L and right half-row 114R.

Left half-rows 110L–113L include left match lines 120L–123L, respectively, which carry left match signals MATCH_$L_0$–MATCH_$L_3$, respectively.

Right half-rows 110R–113R include right match lines 120R–123R, respectively, which carry right match signals MATCH_$R_0$–MATCH_$R_3$, respectively.

Dummy left half-row 114L includes left dummy line 124L, which carries left dummy signal DUMMY_L. Dummy right half-row 114R includes right dummy line 124R, which carries right dummy signal DUMMY_R.

CAM block 10 is illustrated with four rows of CAM cells 110–113 for illustrative purposes only. It is understood that CAM blocks in accordance with the present invention can include other numbers of rows. For example, a CAM block may include 4–24 rows of CAM cells in one embodiment. It is further understood that many CAM blocks (similar to CAM block 10) will be used to create a larger CAM array. For example, a typical CAM array will include hundreds of thousands of rows of CAM cells.

Sense amplifiers 100–103 are located between left-half rows 110L–113L, respectively, and right half-rows 110R–113R, respectively. Locating sense amplifiers 100–103 at the middle of the match lines advantageously reduces the capacitance of each match line by about half, which in turn, improves the speed of CAM block 10. Each of sense amplifiers 100–103 is coupled to a corresponding row of CAM cells 110–113, and to the row of dummy cells 114. Because sense amplifiers 100–103 are identical, only sense amplifier 100 is described in detail.

Figure 2:
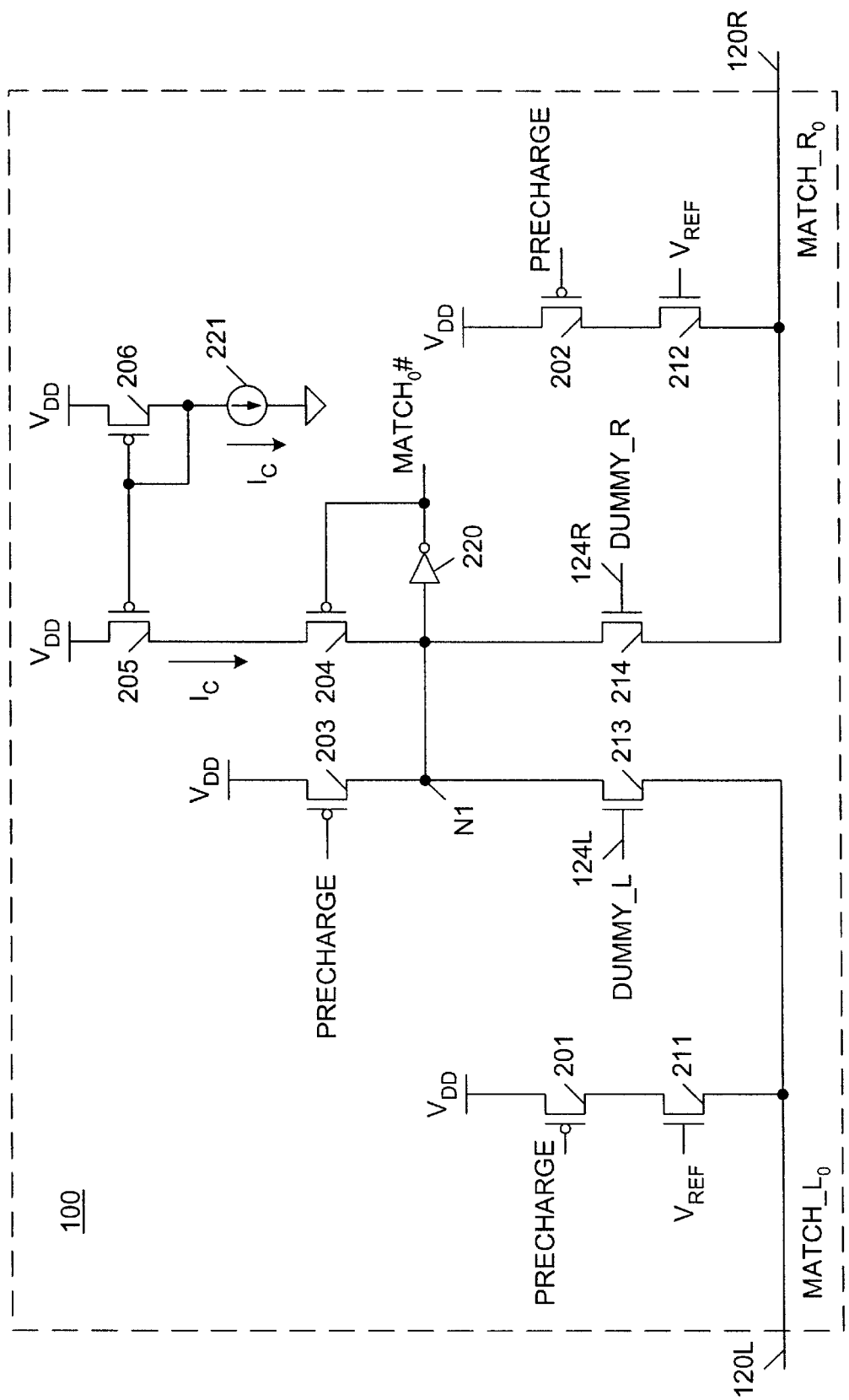
FIG. 2 is a circuit diagram of a sense amplifier of the CAM block of FIG. 1 in accordance with one embodiment of the present invention.

FIG. 2 is a circuit diagram of sense amplifier 100 in accordance with one embodiment of the present invention. Sense amplifier 100 includes p-channel transistors 201–206, n-channel transistors 211–214, inverter 220 and constant current source 221. In the described embodiment, CAM block 10 operates in response to a $V_{DD}$ supply voltage having a nominal voltage greater than 1 Volt (e.g., 1.8 Volts, 2.5 Volts, or 3.3 Volts).

Transistors 201 and 211 are coupled in series between a $V_{DD}$ voltage supply terminal and left match line 120L. Similarly, transistors 202 and 212 are coupled in series between the $V_{DD}$ supply terminal and right match line 120R. The gates of p-channel transistors 201 and 202 are coupled to receive a PRECHARGE signal, and the gates of n-channel transistors 211 and 212 are coupled to receive a reference voltage $V_{REF}$. As described in more detail below, left match line 120L is pre-charged through transistors 201 and 211, and right match line 120R is pre-charged through transistors 202 and 212.

N-channel transistor 213 is coupled between left match line 120L and node N1. Similarly, N-channel transistor 214 is coupled between right match line 120R and node N1. The gates of transistors 213 and 214 are coupled to dummy match lines 124L and 124R, respectively.

N-channel transistors 211–212 are identical transistors that are fabricated to have a first threshold voltage $V_{T1}$. N-channel transistors 213–214 are identical transistors that are fabricated to have a second threshold voltage $V_{T2}$. N-channel transistors 211–214 are fabricated such that the second threshold voltage $V_{T2}$ is greater than the first threshold voltage $V_{T1}$. This can be accomplished using conventional processing techniques, whereby transistors 211–212 receive a first threshold voltage adjustment implant, and transistors 213–214 receive a second threshold voltage adjustment implant, which is different than the first threshold voltage adjustment implant. In the described embodiment, the first threshold voltage $V_{T1}$ is equal to about 0.25 Volts, and the second threshold voltage $V_{T2}$ is equal to about 0.5 Volts. The significance of these different threshold voltages will be apparent in view of the following description.

Transistor 203 is coupled between the $V_{DD}$ supply terminal and node N1. The gate of transistor 203 is coupled to receive the PRECHARGE signal. As described in more detail below, node N1 is pre-charged to a logic high state through transistor 203.

The voltage on node N1 is applied to an input terminal of inverter 220. In response, inverter provides an output signal $MATCH_0\#$, which is equal to the inverse of the signal on node N1. A logic low $MATCH_0\#$ signal identifies a match condition in row 110, while a logic high $MATCH_0\#$ signal identifies a non-match condition in row 110. The $MATCH_0\#$ signal is also applied to the gate of transistor 204.

P-channel transistors 204–205 are coupled in series between the $V_{DD}$ supply terminal and node N1. P-channel transistor 206 and current source 221 are coupled in series between the $V_{DD}$ supply terminal and ground. Constant current source 221 draws a small, constant current $I_C$ on the order of 1 micro-amp. The current through transistor 206 is therefore fixed at the constant current $I_C$. The gate of p-channel transistor 205 is coupled to the gate and the drain of p-channel transistor 206, thereby forming a current mirror circuit. This current mirror circuit causes the constant current $I_C$ to flow through transistor 205, and therefore through transistor 204.

The constant current $I_C$ flowing through transistor 204 helps to maintain a logic high voltage on node N1. Thus, if node N1 is pre-charged to a logic high state, then inverter 220 provides a logic low $MATCH_0\#$ signal, which turns on transistor 204. Turned on transistor 204 weakly pulls node N1 up to the $V_{DD}$ supply voltage, thereby maintaining the high state of node N1. Thus, node N1 is not allowed to float, thereby protecting the logic high state of node N1 from noise in CAM block 10.

If node N1 is pulled down to a logic low state, then inverter 220 provides a logic high $MATCH_0\#$ signal, which turns off transistor 204. At this time, current $I_C$ is not large enough to pull node N1 up to a logic high voltage when node N1 is actively being pulled down to a logic low voltage.

Figure 3:
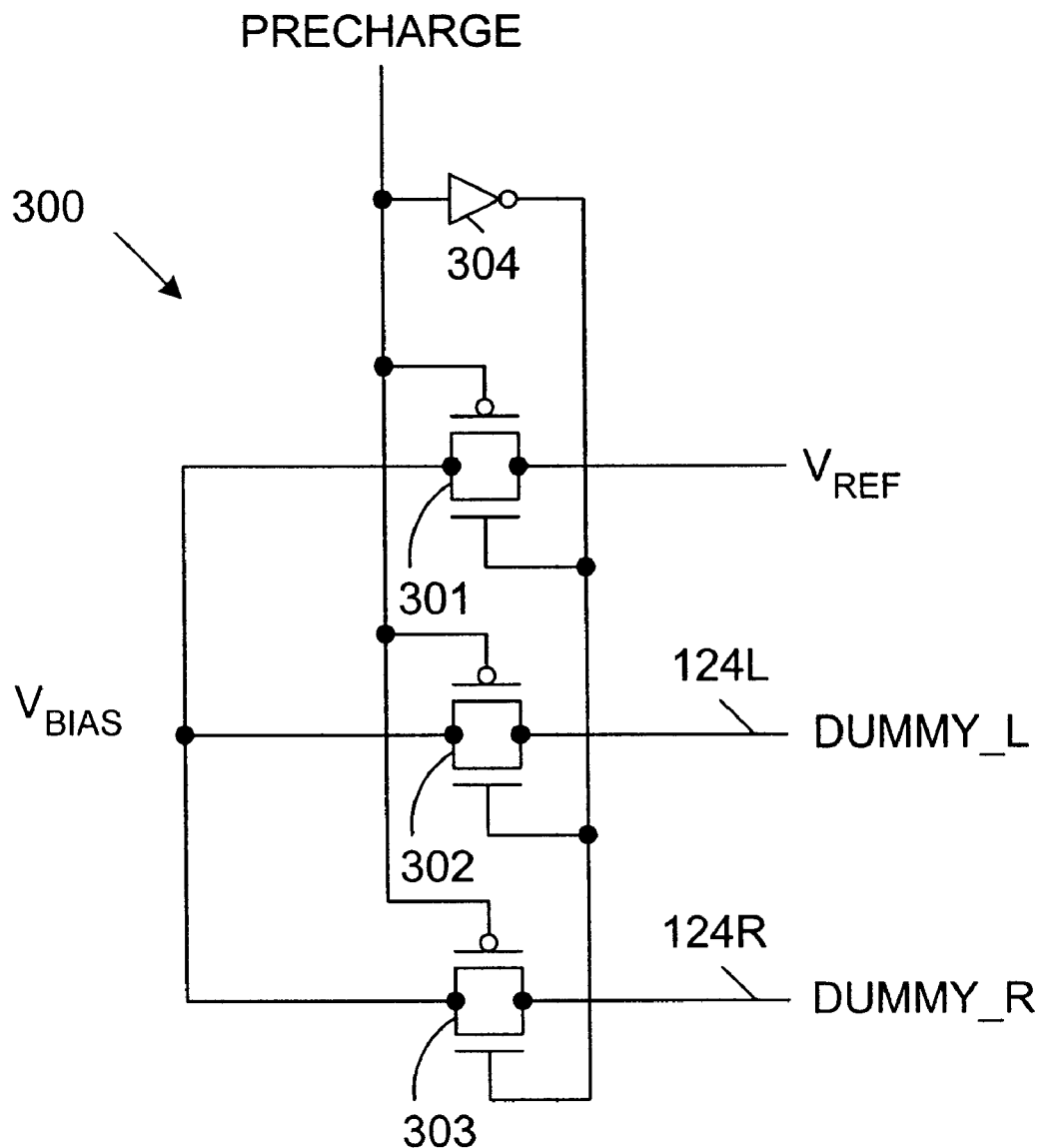
FIG. 3 is a circuit diagram of a voltage supply circuit used to supply the CAM block of FIG. 1 in accordance with one embodiment of the present invention.

FIG. 3 is a circuit diagram of a voltage supply system 300 in accordance with one embodiment of the present invention. Voltage supply system 300 includes transmission gates 301–303 and inverter 304. When the PRECHARGE signal is asserted low, transmission gates 301–303 are turned on, such that the control voltage $V_{BIAS}$ is passed through these transmission gates. Transmission gate 301 passes the $V_{BIAS}$ voltage as the reference voltage $V_{REF}$. Transmission gates 302–303 pass the $V_{BIAS}$ voltage to the left and right dummy lines 124L and 124R as the DUMMY_L and DUMMY_R signals, respectively. In the described example, the control voltage $V_{BIAS}$ has a value of about 1.3 Volts. Power savings are realized by selecting the control voltage $V_{BIAS}$ to be less than the nominal $V_{DD}$ supply voltage. When the PRECHARGE signal is de-asserted high, transmission gates 301–303 are turned off, such that the control voltage $V_{BIAS}$ is not passed by these transmission gates 301–303.

Sense amplifier 100 operates as follows. The PRECHARGE signal is asserted low prior to a compare operation. As a result, p-channel transistors 201 and 202 are turned on, thereby providing the $V_{DD}$ supply voltage to the drains of n-channel transistors 211 and 212. The logic low PRECHARGE signal causes transmission gate 301 to pass the $V_{BIAS}$ voltage to the gates of transistors 211 and 212 (as the $V_{REF}$ signal). Under these conditions, n-channel transistor 211 charges left match line 110L to a voltage equal to $V_{REF}$ minus $V_{T1}$. Similarly, n-channel transistor 212 charges right match line 110R to a voltage equal to $V_{REF}$ minus $V_{T1}$.

The low PRECHARGE signal also causes p-channel transistor 203 to turn on, thereby pulling node N1 up to the $V_{DD}$ supply voltage. In response, inverter 220 provides a logic low $MATCH_0\#$ signal. This logic low $MATCH_0\#$ signal turns on p-channel transistor 204, thereby causing node N1 to be pulled up (weakly) through transistors 204 and 205.

In addition, the logic low PRECHARGE signal causes transmission gates 302–303 to pass the $V_{BIAS}$ voltage to the gates of transistors 213 and 214 (as the DUMMY_L and DUMMY_R signals, respectively). The gate-to-source voltage $V_{GS}$ of transistor 213 is equal to the voltage on the gate of transistor 213, $V_{BIAS}$, minus the voltage on the source of transistor 213, $V_{BIAS} - V_{T1}$. The $V_{GS}$ voltage of transistor 213 is therefore equal to the first threshold voltage $V_{T1}$. As described above, the threshold voltage of transistor 213 is equal to $V_{T2}$, which is greater than $V_{T1}$. Because $V_{T2}$ is greater than $V_{T1}$, the $V_{GS}$ voltage of $V_{T1}$ is not large enough to turn on transistor 213. As a result, transistor 213 remains turned off, thereby isolating node N1 from left match line 120L. Similarly, transistor 214 also remains turned off, thereby isolating node N1 from right match line 120R. As a result, node N1 remains charged to the $V_{DD}$ supply voltage. Note that the noise margin is equal to the difference between threshold voltages $V_{T2}$ and $V_{T1}$, or about 0.25 Volts.

After the above-described pre-charge steps are completed, the PRECHARGE signal is de-asserted high, thereby turning off p-channel transistors 201–203 and transmission gates 301–303. At this time, node N1 is maintained at a logic high voltage through turned on transistor 204. Left and right dummy lines 124L and 124R float at a voltage of $V_{BIAS}$. Left and right match lines 120L and 120R initially float at a voltage of $V_{BIAS}$ minus $V_{T1}$.

A compare operation is then performed, with the contents of each of rows 110–113 being compared with a comparand data word. If the bits of the comparand data word match the bits stored in the CAM cells (MC) of row 110, then left and right match lines 120L and 120R remain floating at a voltage of about $V_{BIAS}$ minus $V_{T1}$. In this case, transistors 213–214 remain off, and node N1 remains at a logic high state. The MATCH$_0$# signal remains at a logic low state, thereby indicating that a match exists.

If the bits of the comparand data word do not match the bits stored in the CAM cells of row 110, then at least one of the match lines 120L and 120R will be pulled down toward ground. That is, any CAM cell storing a bit that does not match a corresponding bit of the comparand word will pull the corresponding match line down toward ground. For example, if the contents of a CAM cell coupled to left match line 120L does not match the corresponding comparand bit, then left match line 120L will be pulled down toward ground. As the left match line 120L is pulled down, the $V_{GS}$ voltage of transistor 213 will increase from $V_{T1}$ toward $V_{BIAS}$. When the $V_{GS}$ voltage of transistor 213 exceeds $V_{T2}$ (i.e., the threshold voltage of transistor 213), transistor 213 turns on, thereby pulling down node N1 to a logic low level. At this time, inverter 220 drives the MATCH$_0$# signal to a logic high state. The logic high MATCH$_0$# signal identifies a non-match condition.

Advantageously, sense amplifier 100 exhibits low power consumption, because node N1 is pulled down to a logic low value before the source of transistor 213 (or transistor 214) is pulled all the way to ground. As a result, only a small signal swing is required on a match line to indicate a non-match condition.

Moreover, note that transistors 213 and 214 capacitively couple left and right match lines 120L and 120R with left and right dummy lines 124L and 124R, respectively. Thus, when a match line is pulled down due to a non-match condition, the corresponding dummy line is also pulled down as a result of this capacitive coupling. For example, assume that left match lines 121L–123L are all pulled down due to non-match conditions, thereby pulling down on the voltage of left dummy line 124L. The voltage on left dummy line 124L at this time is equal to $V_{BIAS}$ minus $V_c$, where $V_c$ is equal to the voltage drop on left dummy line 124L due to the capacitively coupled pulled down left match lines 121L–123L.

The lower voltage on left dummy line 124L has the following effect within sense amplifier 100. The gate of transistor 213 is held at a voltage equal to $V_{BIAS}$ minus $V_c$ (i.e., the voltage on left dummy line 124L). As a result, it becomes a little more difficult to turn on transistor 213. That is, the voltage on left match line 120L must drop from the initial voltage of $V_{BIAS}$ minus $V_{T1}$, to a voltage of $V_{BIAS}$ minus $V_{T2}$ minus $V_c$ in order to turn on transistor 213. Because it takes a larger voltage drop on left match line 120L to turn on transistor 213, it becomes less likely that transistor 213 will turn on erroneously in the presence of a noise condition. More specifically, the noise margin is increased to $(V_{T2}+V_c)-V_{T1}$. CAM block 10 is therefore a relatively robust circuit, having a good noise margin.

Although the invention has been described in connection with several embodiments, it is understood that this invention is not limited to the embodiments disclosed, but is capable of various modifications, which would be apparent to a person skilled in the art. For example, in an alternate embodiment, the CAM block can be simplified such that each sense amplifier is coupled to a single match line and a single dummy line. Although there are advantages to locating the sense amplifiers in the middle of the match lines, this is not necessary. In an alternate embodiment, each sense amplifier is coupled to receive one match line and one dummy line. Thus, the invention is limited only by the following claims.

What is claimed is:

1. A sense amplifier comprising:
   a voltage supply terminal for receiving a supply voltage;
   a storage node for storing a voltage representative of a match or no-match condition;
   a first transistor coupled between a first match line of a content addressable memory (CAM) array and the voltage supply terminal, the first transistor having a first threshold voltage $V_{T1}$; and
   a second transistor coupled between the first match line and the storage node, the second transistor having a gate coupled to a first dummy line of the CAM array, the second transistor having a second threshold voltage $V_{T2}$, which is greater than $V_{T1}$.

2. The sense amplifier of claim 1, further comprising;
   a first precharge transistor coupled between the first transistor and the voltage supply terminal; and
   a second precharge transistor coupled between the storage node and the voltage supply terminal, wherein the first and second precharge transistors have gates coupled to receive a precharge control signal.

3. The sense amplifier of claim 2, further comprising:
   an inverter having an input terminal coupled to the storage node and an output terminal providing a match signal;
   a pull-up transistor having a gate coupled to the output terminal of the inverter, and a drain coupled to the storage node; and
   a current mirror circuit coupled to the source of the pull-up transistor.

4. The sense amplifier of claim 1, further comprising:
   a third transistor coupled between a second match line of the CAM array and the voltage supply terminal, wherein the first and second match lines combine to form a single match line, the third transistor having the first threshold voltage $V_{T1}$; and
   a fourth transistor coupled between the second match line and the storage node, the fourth transistor having a gate coupled to a second dummy line of the CAM array, wherein the first and second dummy lines combine to form a single dummy line, the fourth transistor having the second threshold voltage $V_{T2}$.

5. A content addressable memory (CAM) block comprising:
   a first CAM row having a plurality of CAM cells coupled to a first match line;

a dummy row having a plurality of dummy cells coupled to a dummy line, the dummy row having electrical characteristics similar to the first CAM row;

a first sense amplifier coupled to the first match line and the dummy line, the first sense amplifier including:

a first transistor coupled between the first match line and a voltage supply terminal, the first transistor having a first threshold voltage $V_{T1}$;

a second transistor coupled between the first match line and a storage node, wherein the gate of the second transistor is coupled to the dummy line, and the second transistor has a second threshold voltage $V_{T2}$, which is greater than $VT_1$.

6. The CAM block of claim 5, wherein the sense amplifier further comprises:

a first precharge transistor coupled between the first transistor and the voltage supply terminal;

a second precharge transistor coupled between the storage node and the voltage supply terminal; and means for applying a precharge control signal to a gate of the first precharge transistor and a gate of the second precharge transistor.

7. The CAM block of claim 6, further comprising a voltage supply circuit configured to apply a bias voltage, which is less than the supply voltage, to a gate of the first transistor and to the dummy line.

8. The CAM block of claim 6, wherein the sense amplifier further comprises:

an inverter having an input terminal coupled to the storage node and an output terminal providing a match signal;

a pull-up transistor having a gate coupled to the output terminal of the inverter, and a drain coupled to the storage node; and a current mirror circuit coupled to the source of the pull-up transistor.

9. The CAM block of claim 5, wherein the sense amplifier further comprises:

a third transistor coupled between a second match line of the CAM array and the voltage supply terminal, wherein the first and second match lines combine to form a single match line, the third transistor having the first threshold voltage $V_{T1}$; and a fourth transistor coupled between the second match line and the storage node, the fourth transistor having a gate coupled to a second dummy line of the CAM array, wherein the first and second dummy lines combine to form a single dummy line, the fourth transistor having the second threshold voltage $V_{T2}$.

10. A method of implementing a sense amplifier in a content addressable memory (CAM) array comprising:

pre-charging a first match line of the CAM array through a first transistor having a first threshold voltage $V_{T1}$, wherein the first match line is pre-charged to a voltage equal to a reference voltage minus the first threshold voltage $V_{T1}$;

pre-charging a dummy line of the CAM array to the reference voltage, wherein the dummy line is coupled to a gate of a second transistor having a second threshold voltage $V_{T2}$, wherein $V_{T2}$ is greater than $V_{T1}$;

pre-charging a storage node to a supply voltage, wherein the supply voltage is greater than the reference voltage; and coupling the first match line to the output node through the second transistor if the voltage on the dummy line exceeds the voltage on the first match line by more than the second threshold voltage $V_{T2}$.

* * * * *